United States Patent [19]
Izumi

[11] Patent Number: 5,943,281
[45] Date of Patent: Aug. 24, 1999

[54] SEMICONDUCTOR INTEGRATED CIRCUIT REDUCING UNDESIRED CURRENT

[75] Inventor: Seiji Izumi, Kawasaki, Japan

[73] Assignee: NEC Corporation, Tokyo, Japan

[21] Appl. No.: 09/121,032

[22] Filed: Jul. 23, 1998

[30] Foreign Application Priority Data

Jul. 29, 1997 [JP] Japan ................................ 9-203608

[51] Int. Cl.$^6$ ................................................ G11C 7/00
[52] U.S. Cl. .................................... 365/225.7; 365/194
[58] Field of Search .............................. 365/225.7, 200, 365/194

[56] References Cited

U.S. PATENT DOCUMENTS

| | | | |
|---|---|---|---|
| 5,677,882 | 10/1997 | Isa et al. ............................. | 365/225.7 |
| 5,708,619 | 1/1998 | Gillingham ........................... | 365/225.7 |
| 5,768,197 | 6/1998 | Choi .................................... | 365/225.7 |
| 5,777,931 | 7/1998 | Kwon et al. ......................... | 365/225.7 |

FOREIGN PATENT DOCUMENTS

| | | |
|---|---|---|
| 4-342919 | 11/1992 | Japan . |
| 7-14924 | 1/1995 | Japan . |

*Primary Examiner*—Son T. Dinh
*Attorney, Agent, or Firm*—Sughrue, Mion, Zinn, Macpeak & Seas, PLLC

[57] ABSTRACT

A semiconductor integrated circuit using a fuse element is provided, in which current flowing through the fuse element or a neighboring circuit area is reduced. The fuse element may be inserted in an inverter consisting of two MOSFETs, so as to reduce the current which directly flows through the fuse element. A flip-flop circuit is provided at the rear stage for judging whether the fuse is disconnected or not. The flip-flop circuit can be operated according to timing data generated by using an internal delay circuit, so as to reduce the current which flows to a neighboring circuit area.

4 Claims, 8 Drawing Sheets

SEMICONDUCTOR INTEGRATED CIRCUIT REDUCING UNDESIRED CURRENT

BACKGROUND OF THE INVENTION

1. Field of the Invention

The present invention relates to a semiconductor integrated circuit, in particular, relates to those comprising a fuse element.

This application is based on Patent Application No. Hei 9-203608 filed in Japan, the contents of which are incorporated herein by reference.

2. Description of the Related Art

A conventional redundancy circuit is known in which, regarding a RAM or the like, a redundant or extra cell is previously formed so as to improve a yield. In such a circuit, if a failure is found in a regular RAM cell, this substandard cell is separated by disconnecting a relevant fuse and is replaced with the above extra cell.

The disconnection or non-disconnection of the fuse is internally represented using a High/Low state or a high impedance state of a signal. The High/Low state can easily be represented using an internal logic. However, judgment of the high impedance state is difficult in the circuit. Therefore, in the conventional circuit, a fuse element is regarded as a resistor element to which current is applied, and necessity of disconnection of the fuse is judged according to a generated potential difference.

FIG. 5 is a circuit diagram showing an example of the conventional redundancy circuit (refer to FIG. 4 in Japanese Patent Application, First Publication, No. Hei 4-342919). In the figure, between the VDD and GND levels, fuse element 1 and resistor element 2 are inserted in a series connection. To a node in the series connection, the input of inverter element 3 and the drain of NMOS element 4 are connected. In addition, the output of the above inverter element 3 is connected to fuse detective output 5 and the gate of the above NMOS element 4, and the source of the NMOS element 4 is connected to the GND.

Operations of the conventional redundancy circuit having the above structure will be explained below. By designing the resistance (value) of fuse element 1 so that it is sufficiently smaller than that of resistor element 2, a High signal is input into inverter 3 from which a Low signal is output while fuse element 1 is not disconnected. Accordingly, a Low signal is output as fuse detective output 5. With resistance Rf of fuse element 1, resistance R of resistor element 2, source voltage Vdd, and threshold Vt of inverter 3, the resistance ratio (i.e., Rf/R) has the following criterion.

$$Rf/R << Vt/(Vdd-Vt)$$

On the other hand, while fuse element 1 is disconnected, a Low signal is input into inverter 3 via resistor element 2; thus, a High signal is output from the inverter 3. Therefore, the High level is input into the gate of NMOS element 4 and the element 4 becomes conductive, and thus the input level of inverter 3 becomes "Low". Accordingly, a High signal is output as fuse detective output 5, which is the output from inverter 3. That is, as fuse detective output 5, the Low level is output while fuse element 1 is not disconnected, and the High level is output while fuse element 1 is disconnected.

FIG. 6 is a circuit diagram showing the second example of the conventional redundancy circuit (refer to FIG. 1 in Japanese Patent Application, First Publication, No. Hei 4-342919) as an improved circuit relating to the above first example. In the figure, fuse element 7 is connected with the VDD terminal, and the drain of NMOS element 8 is connected with the other end of the fuse element 7. The source of the NMOS element 8 is connected to the GND, while the gate of this element is connected to input terminal 6. In addition, the input of inverter element 9 and the drain of NMOS element 10 are connected to the drain of NMOS element 8. The output of the above inverter element 9 is connected with fuse detective output 11 and the gate of the above NMOS element 10, and the source of the NMOS element 10 is connected to the GND.

Operations using the above-explained structure of the second conventional example will be explained with reference to the timing chart of FIG. 7. While fuse element 7 is not disconnected and input terminal 6 has a Low level in the initial phase, NMOS element 8 is not conductive and a High signal is input into inverter 9 via fuse element 7 and a Low signal is output from the inverter. Therefore, the Low signal is output as fuse detective output 11. If the resistance of fuse element 7 is designed to be sufficiently smaller than the resistance between the source and the drain of NMOS element 8 in a conductive state, a High signal is input into inverter 9 while the input terminal 6 has a High level. Therefore, a Low signal is output from the inverter 9 and the Low signal is output as fuse detective output 11.

For example, with resistance Rf of fuse element 7, total resistance R of a series of the resistance of conductive NMOS element 8 and the resistance of another resistor (which is inserted in a series form because it is generally difficult for the NMOS element to obtain a desirable amount of resistance), source voltage Vdd, and threshold Vt of inverter element 9, the resistance ratio (i.e., Rf/R) has the following criterion.

$$Rf/R << Vt/(Vdd-Vt)$$

While fuse element 7 is disconnected and input terminal 6 has a Low level in the initial phase, NMOS element 8 is not conductive and the input of inverter element 9 becomes indefinite and then fuse detective output 11 becomes its initial state. On the other hand, while input terminal 6 has a High level, NMOS element 8 is conductive and a Low signal is input into inverter element 9 which then outputs a High signal. In addition, the High signal is input into the gate of NMOS element 10, and this element 10 becomes conductive and the input of inverter 9 becomes "Low". Therefore, as fuse detective output 11, a High signal is output, which is the output of inverter element 9.

Even after input terminal 6 changes from a High level to a Low level and NMOS element 8 becomes non-conductive (i.e., the "off" state), data of the "High" state at input terminal 6 is secured via inverter 9 and NMOS element 10, and a High signal is output as fuse detective output 11. That is, after fuse 7 is disconnected with input terminal 6 being in a High state, regardless of the state of the input terminal, a Low signal is output as fuse detective output 11 while fuse element 7 is not disconnected, and a High signal is output as fuse detective output 11 while fuse element 7 is disconnected.

Next, FIG. 8 is a circuit diagram showing the third example (refer to FIG. 1 in Japanese Patent Application, First Publication, No. Hei 7-14924) as an improved circuit relating to the above examples. In the figure, PMOS element 13 and NMOS element 14 are connected with each other in a complementary form, which thus realizes inverter 23. Fuse element 15 is inserted between the source of NMOS element 14 and the GND. Similarly, PMOS element 18 and NMOS element 17 are complementarily connected, which thus realizes inverter 24. Fuse element 16 is inserted between the source of NMOS element 17 and the VDD. The inputs of inverters 23 and 24 are connected with input terminal 12, and to the output of inverter 23, the input of inverter 19 and the output of inverter 20 are connected. In addition, to the output of inverter 24, the input of inverter 20, the output of inverter 19, and fuse detective output 21 are connected.

Operations using the above-explained structure of the third conventional example will be explained with reference to the timing chart of FIG. 9. While fuse elements 15 and 16 are not disconnected and input terminal 12 has a Low level in the initial phase, inverter 23 outputs a High signal and inverter 24 outputs a Low signal. Therefore, the High signal is input into inverter 19 which then outputs a Low signal, while the above Low signal is input into inverter 20 which then outputs a High signal. The fuse detective output 21 thus becomes "Low". While the above input terminal 12 has a High level, inverter 23 outputs a Low signal and inverter 24 outputs a High signal. The Low signal is input into inverter 19 which then outputs a High signal, while the above High signal is input into inverter 20 which then outputs a Low signal. The fuse detective output 21 thus becomes "High".

While fuse elements 15 and 16 are disconnected and input terminal 12 has a Low level in the initial phase, PMOS elements 13 and 18 are conductive while NMOS elements 14 and 17 are non-conductive. Therefore, a High signal is input into inverter 19 which then outputs a Low signal, while a Low signal is input into inverter 20 which then outputs a High signal. The fuse detective output 21 thus becomes "Low". While the above input terminal 12 has a High level, PMOS elements 13 and 18 are non-conductive while NMOS elements 14 and 17 are conductive.

However, as fuse element 15 is disconnected, the drain of the above NMOS element 14 does not become "Low". Similarly, as fuse element 16 is disconnected, the drain of the above NMOS element 17 does not become "High". Therefore, the input terminal 12 maintains the Low level via inverter elements 19 and 20 and fuse detective output 21 is thus a Low level. That is, in a High state of input terminal 12, fuse detective output 21 becomes "High" while fuse elements 15 and 16 are not disconnected, and fuse detective output 21 becomes "Low" while fuse elements 15 and 16 are disconnected.

In the first conventional example as shown in FIG. 5, with resistance Rf of fuse element 1, resistance R of resistor element 2, and a source voltage Vdd, even though the fuse is not disconnected, stationary current I(=Vdd/(Rf+R)) flows between the VDD-GND terminals through a path such as VDD→fuse element 1→resistor element 2→GND.

In order to solve the above problem, in the above second conventional example, such stationary current is reduced using a signal input from the outside. However, with resistance Rf of fuse element 7, total resistance R of a series of an NMOS element 8 and another resistor, and a source voltage Vdd, while the fuse is not disconnected and a High signal is supplied to input terminal 6, NMOS element 8 is conductive and stationary current I (=Vdd/(Rf+R), similar to that in the first conventional example) flows between the VDD-GND terminals through a path such as VDD→fuse element 7→NMOS element 8→GND.

Also in order to solve the above problem and to reduce the stationary current, the third conventional example has a CMOS structure between the VDD-GND terminals. However, if the input signal changes from "Low" to "High", or from "High" to "Low", during the non-disconnective state of the fuse, a collision between output signals of inverters 23 and 20 and a collision between output signals of inverters 24 and 19 occur for each change and a current according to each collision flows in the circuit.

In order to solve the above-mentioned problem according to the second conventional example, a signal in which the High-state period is reduced as much as possible is necessary in the fourth conventional example. In addition, in order to solve the above-mentioned problem according to the third conventional example, a signal in which level changes are reduced as much as possible is necessary also in the fourth conventional example. If such a signal cannot be supplied from the outside, it is necessary to construct a signal generating circuit inside; thus, a signal operating at the time of applying a power source, such as a one-shot signal, must be used as an input signal. However, in the design of a one-shot signal generating circuit, dispersion in manufacture, voltage fluctuation, and environmental fluctuation must be considered. In addition, there occurs a problem in which such a generating circuit occupies a large area.

SUMMARY OF THE INVENTION

In consideration of the above circumstances, the present invention has an objective to provide a semiconductor integrated circuit for reducing power consumption according to a stationary current and a current generated due to a collision between output signals, and for using a non-restricted input signal.

Therefore, the present invention provides a semiconductor integrated circuit comprising: a fuse circuit for judging whether a fuse element is disconnected or not by using an output signal output in relation to an input signal, wherein at least one fuse element is inserted, and if the fuse element is not disconnected, then the output signal is inverted with respect to the input signal, while if the fuse element is disconnected, then the level of the output signal is fixed to that of a source voltage or a ground voltage regardless of the input signal; a flip-flop circuit whose input is the output of the fuse circuit; and a delay circuit for delaying the input signal, wherein the output of the delayed circuit becomes the clock input of the flip-flop circuit, and information indicating whether the fuse element is connected or not is output form the flip-flop circuit.

In the above structure, the flip-flop circuit is used as a rear element in the semiconductor integrated circuit; thus, no short portion between output signals exists in the circuit. Therefore, it is possible to suppress current due to a collision between output signals in the circuit, the current being generated when the state of input data is changed.

The fuse circuit may comprise a CMOS inverter circuit including a first conductive MOSFET and a second conductive MOSFET, and said at least one fuse element may be inserted at the side of the drain or the source of any one of the first and second conductive MOSFETs.

In this case, a fuse element is inserted in the inverter, and one of the MOSFETs (e.g., PMOS and NMOS elements) becomes non-conductive. In this way, a stationary current via a fuse can be suppressed.

The flip-flop circuit may include a clocked inverter as an initial stage input element of the circuit.

The semiconductor integrated circuit may further comprise a signal-width adjustment circuit for adjusting the width of the input signal to have a predetermined period possible for capacitively maintaining a High level.

Consequently, a stationary current and a current due to a collision between output signals can be suppressed; thus, a one-shot signal as an input signal is unnecessary and thus no restriction is imposed on the input signal. Regarding this advantage of no one-shot input signal, a clock signal can be used as input. Additionally, a circuit for generating such a one-shot signal is unnecessary; thus, necessary design hours and necessary circuit area can be reduced.

DESCRIPTION OF THE PREFERRED EMBODIMENTS

Hereinbelow, the embodiments of the present invention will be explained in detail.

A. First Embodiment

A-1. Structure of First Embodiment

Figure 1:
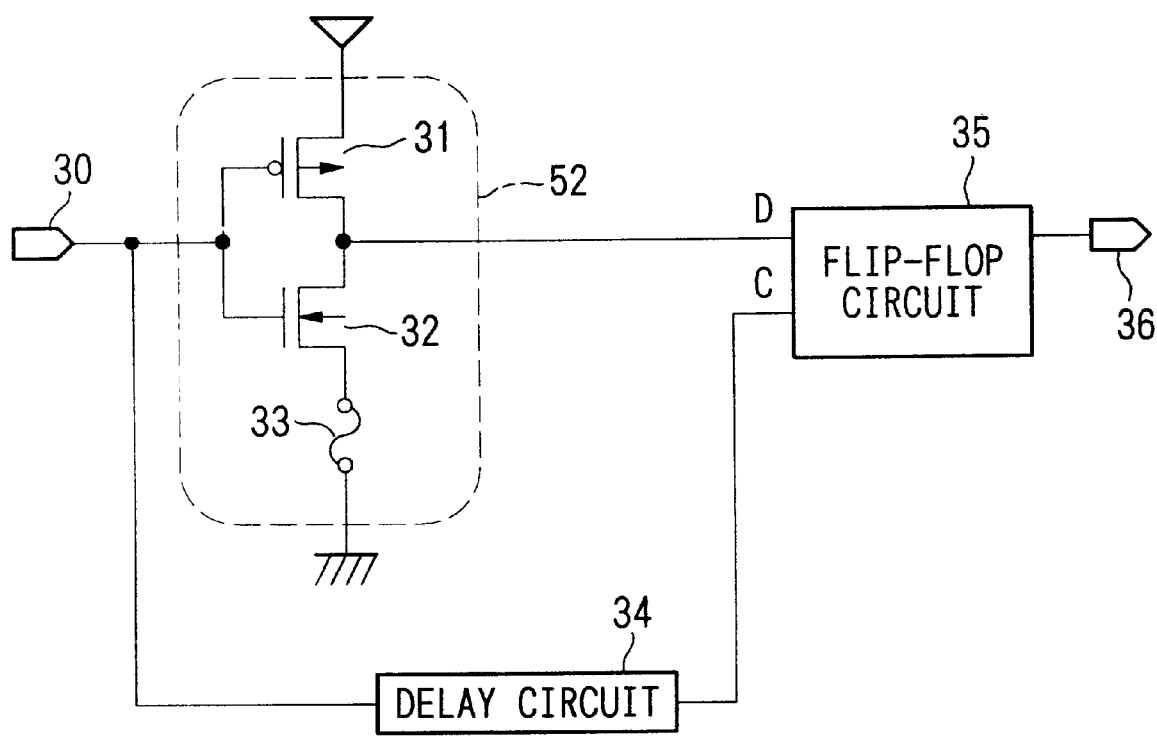
FIG. 1 is a general circuit diagram showing a structure of the first embodiment according to the present invention.

FIG. 1 is a circuit diagram showing a configuration of the semiconductor integrated circuit of the first embodiment according to the present invention. In the figure, PMOS element 31 (i.e., the first MOSFET) and NMOS element 32 (i.e., the second MOSFET) are complementarily connected so as to construct inverter 52 (i.e., CMOS inverter circuit), and fuse element 33 is inserted between the source of NMOS element 32 and the GND. The output of inverter 52 is connected to the data input terminal of flip-flop circuit 35. Input terminal 30 is connected with the input of the above inverter 52 and the input of delay circuit 34, and the output of the delay circuit 34 is connected to the clock input terminal of the flip-flop circuit 35. The output of flip-flop circuit 35 is connected to fuse detective output 36.

A-2. Operations of First Embodiment

Operations of the first embodiment having the above-explained structure will be explained with reference to the timing chart shown in FIG. 2. While fuse element 33 is not disconnected and input terminal 30 has a Low level in the initial phase, PMOS element 31 is conductive and NMOS element 32 is non-conductive. In this case, the data input of flip-flop circuit 35 has a High level while the clock input thereof has a Low level. As a result, the output of flip-flop circuit 35 has the initial state and fuse detective output 36 also has its initial state.

When the input of input terminal 30 changes from the Low level to the High level, PMOS element 31 changes from the conductive state to the non-conductive state while NMOS element 32 changes from the non-conductive state to the conductive state. Accordingly, the data input of flip-flop circuit 35, which is the outputs of PMOS element 31 and NMOS element 32 as constituents of inverter 52, changes from the High state to the Low state, while the clock input of the flip-flop circuit 35, which is delayed via delay circuit 34, changes from the Low state to the High state. The "Low" data as the output of the above inverter 52 is provided to flip-flop circuit 35 at the rise time of the clock input of flip-flop circuit 35, and fuse detective output 36 outputs data of the Low level.

When the input of input terminal 30 again becomes "Low" afterward, PMOS element 31 becomes conductive while NMOS element 32 becomes non-conductive. Accordingly, the data input of flip-flop circuit 35 becomes "High" and the clock input thereof becomes "Low". Here, flip-flop circuit 35 outputs the data of the Low level acquired when the state of input terminal 30 changes from "Low" to "High"; thus, fuse detective output 36 outputs a Low signal.

While fuse 33 is disconnected and input terminal 30 is a Low level at the initial phase, PMOS element 31 is non-conductive and NMOS element is conductive, and thus the data input of flip-flop circuit 35 has a High level. In this situation, the clock input of flip-flop circuit 35 has a Low level, and thus the output of flip-flop circuit 35 becomes the initial state and fuse detective output 36 also becomes its initial state.

When the input level of input terminal 30 changes from "Low" to "High" afterward, the state of PMOS element 31 changes from conductive to non-conductive. The data input of flip-flop circuit 35 maintains the High level during a fixed time by keeping capacity from the output of the inverter to the input of flip-flop circuit 35. On the other hand, the clock input, delayed by delay circuit 34, changes from "Low" to "High". The above capacity-maintained data is provided to flip-flop circuit 35 at the rise time of the clock input of the flip-flop circuit 35, and fuse detective output 36 then outputs data of the High level.

When the input of input terminal 30 again becomes "Low" afterward, PMOS element 31 becomes conductive while NMOS element 32 becomes non-conductive. Accordingly, the data input of flip-flop circuit 35 becomes "High" and the clock input thereof becomes "Low". Here, flip-flop circuit 35 outputs the data of the High level acquired when the state of input terminal 30 changes from "Low" to "High"; thus, fuse detective output 36 outputs a High signal.

That is, once input terminal 30 changes from the Low state to the High state, regardless of the state of input terminal 30, fuse detective output 36 outputs a Low signal while fuse 33 is not disconnected, and outputs a High signal while fuse 33 is disconnected.

B. Second Embodiment

Figure 3:
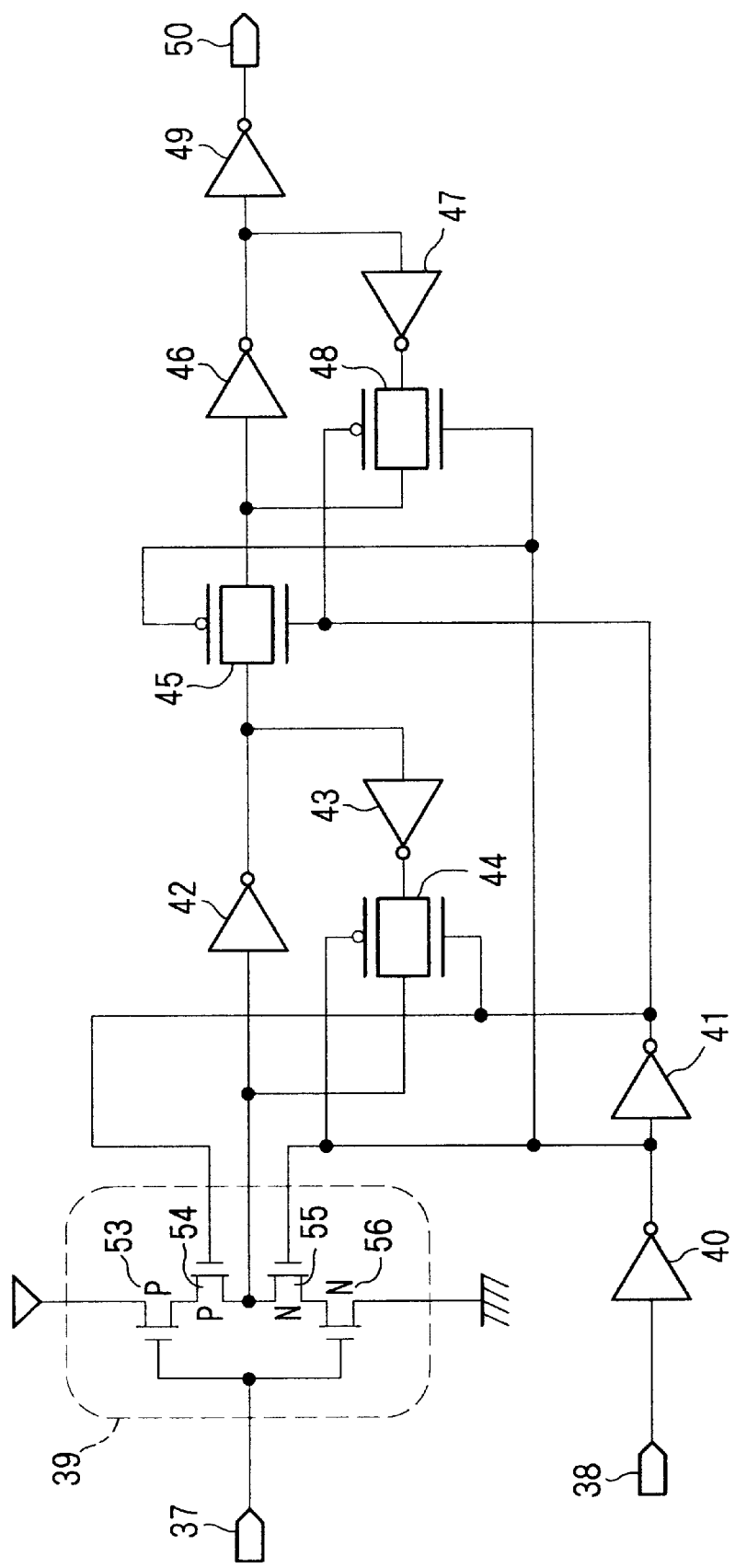
FIG. 3 is a circuit diagram showing a structure of the flip-flop included in the first embodiment, as the second embodiment according to the present invention.

FIG. 3 is a circuit diagram showing a structure of flip-flop circuit 35 included in the first embodiment, as the second embodiment according to the present invention. In the figure, data input terminal 37 is connected to the gates of PMOS element 53 and NMOS element 56. The PMOS element 53, PMOS element 54, NMOS element 55, and NMOS element 56 are connected in a serial form and constructs a clocked inverter 39.

The output of clocked inverter 39 is connected to the input of inverter 42 and to one terminal of transfer gate 44. The output of the above inverter 42 is connected to the input of inverter 43 and one terminal of transfer gate 45. The output of the above inverter 43 is connected to the other terminal of transfer gate 44.

Additionally, the other terminal of the above transfer gate 45 is connected to the input of inverter 46 and one terminal of transfer gate 48. The output of the above inverter 46 is connected to the input of inverter 49 and the input of inverter 47. The output of the above inverter 49 is connected to data output terminal 50, and the output of the above inverter 47 is connected to the other terminal of the above-mentioned transfer gate 48.

On the other hand, the clock input terminal 38 is connected to the input of inverter 40, the output of which is connected to the gate of the NMOS element 55, the PMOS-side gate of the transfer gate 44, the PMOS-side gate of the transfer gate 45, the NMOS-side gate of the transfer gate 48, and the input of inverter 41. The output of the inverter 41 is connected to the gate of the PMOS element 54, the NMOS-side gate of the transfer gate 44, the NMOS-side gate of the transfer gate 45, and the PMOS-side gate of the transfer gate 48.

Figure 2:
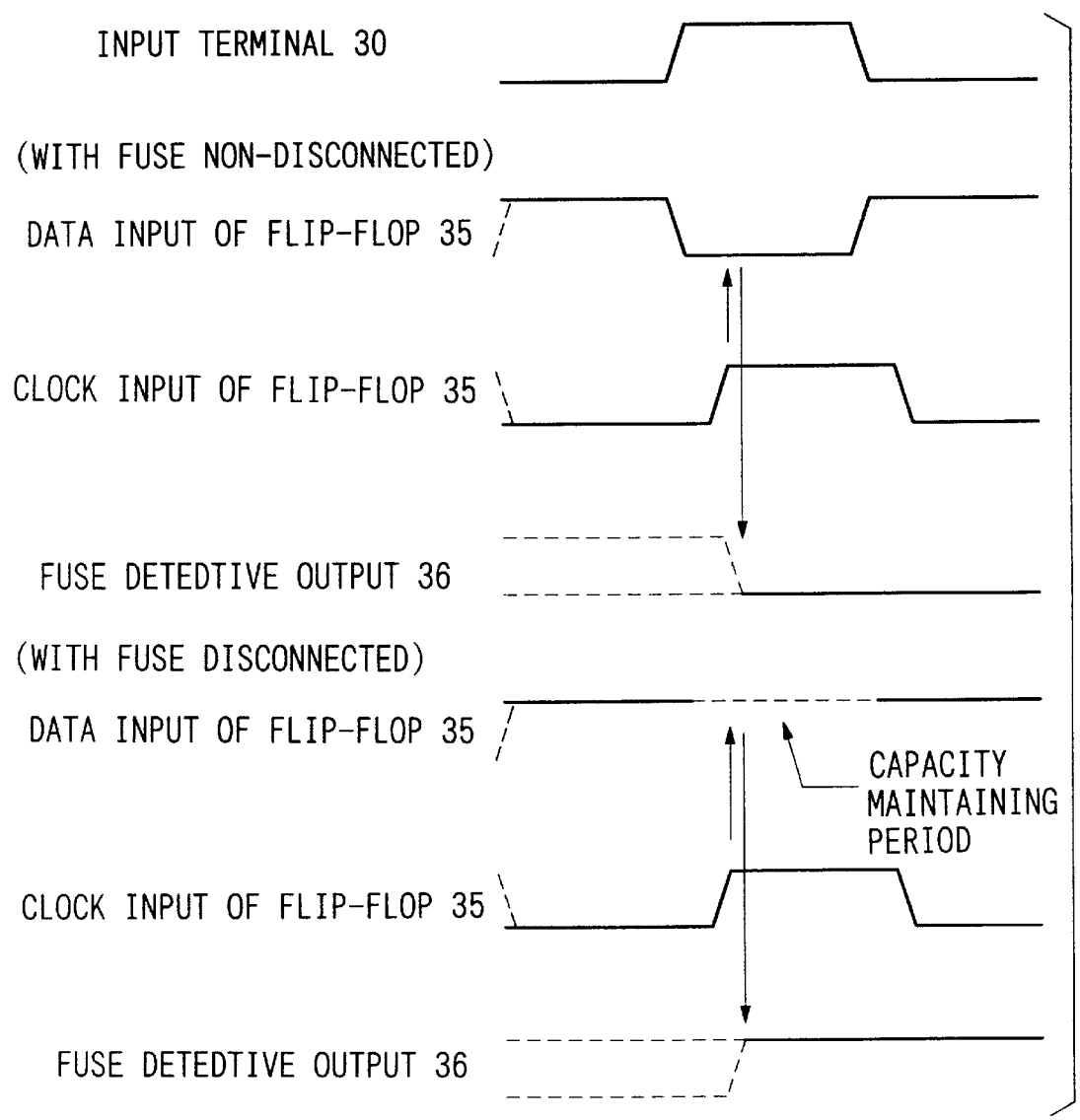
FIG. 2 is a timing chart showing operations of the first embodiment.

In the above operational explanations referring to FIG. 2, while fuse 33 is disconnected and the input of input terminal 30 has a High level, it is necessary to maintain the level of the data input of flip-flop circuit 35 to be "High" during a fixed time, by keeping capacity from the output of inverter 52 to the input of flip-flop circuit 35. However, if a long fixed time is necessary, it may be difficult to maintain the High level because of leakage or the like, and in the worst case, the voltage may be lowered to the intermediate level. If such an input signal is applied to an inverter as the input stage of a flip-flop circuit, a great deal of current passes through the line. Therefore, in the second embodiment, the inverter at the input stage and the transfer gate shown in FIG. 1 are replaced with clocked inverter 39 shown in FIG. 3, which operates in synchronism with the clock. In this way, a through current, generated when input terminal 30 maintains the High level for a long time, is prevented.

C. Third Embodiment

Figure 4:
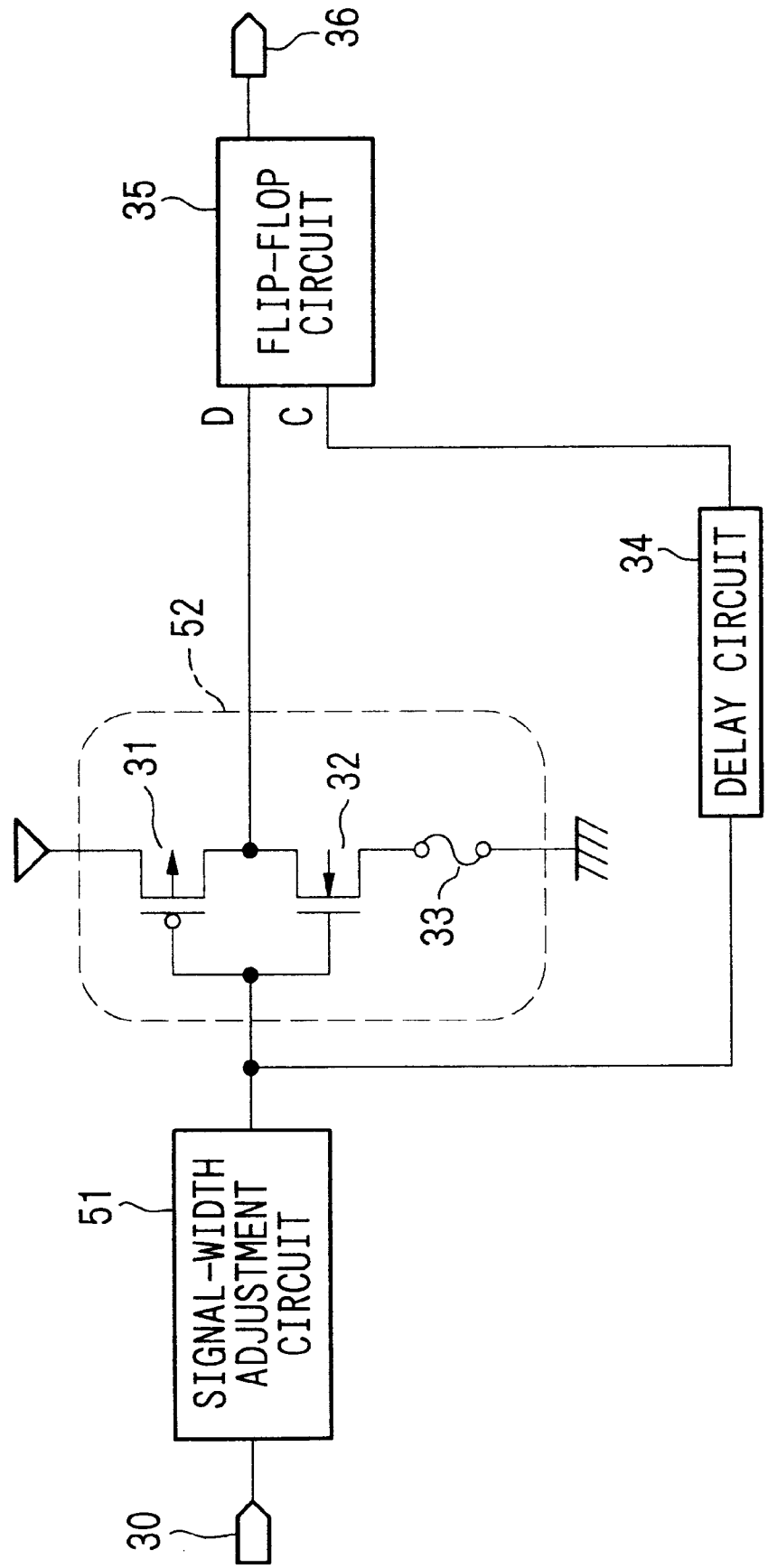
FIG. 4 is a circuit diagram showing a structure of the third embodiment according to the present invention.
Figure 5:
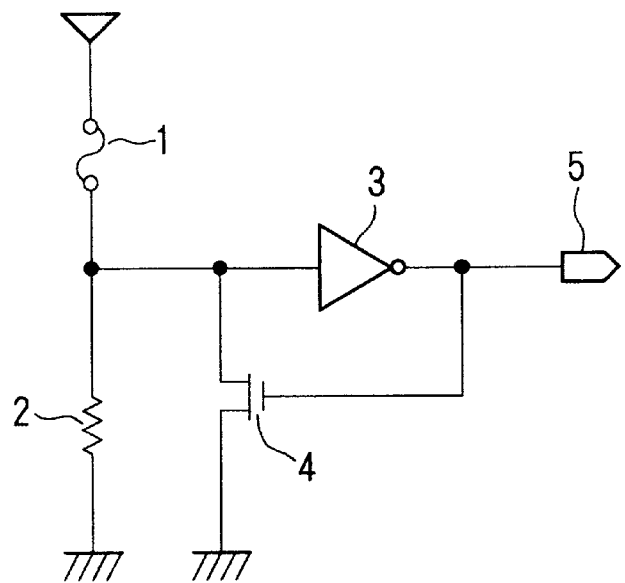
FIG. 5 is a circuit diagram showing the first conventional example.
Figure 6:
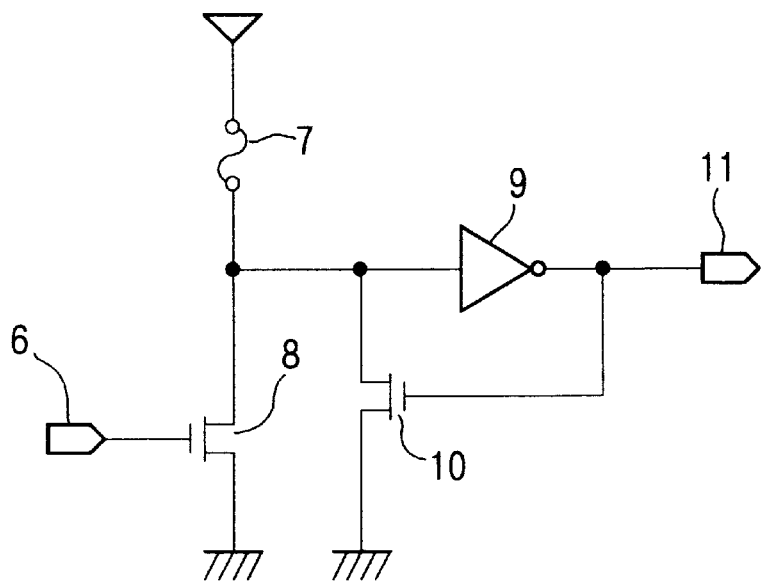
FIG. 6 is a circuit diagram showing the second conventional example.
Figure 7:
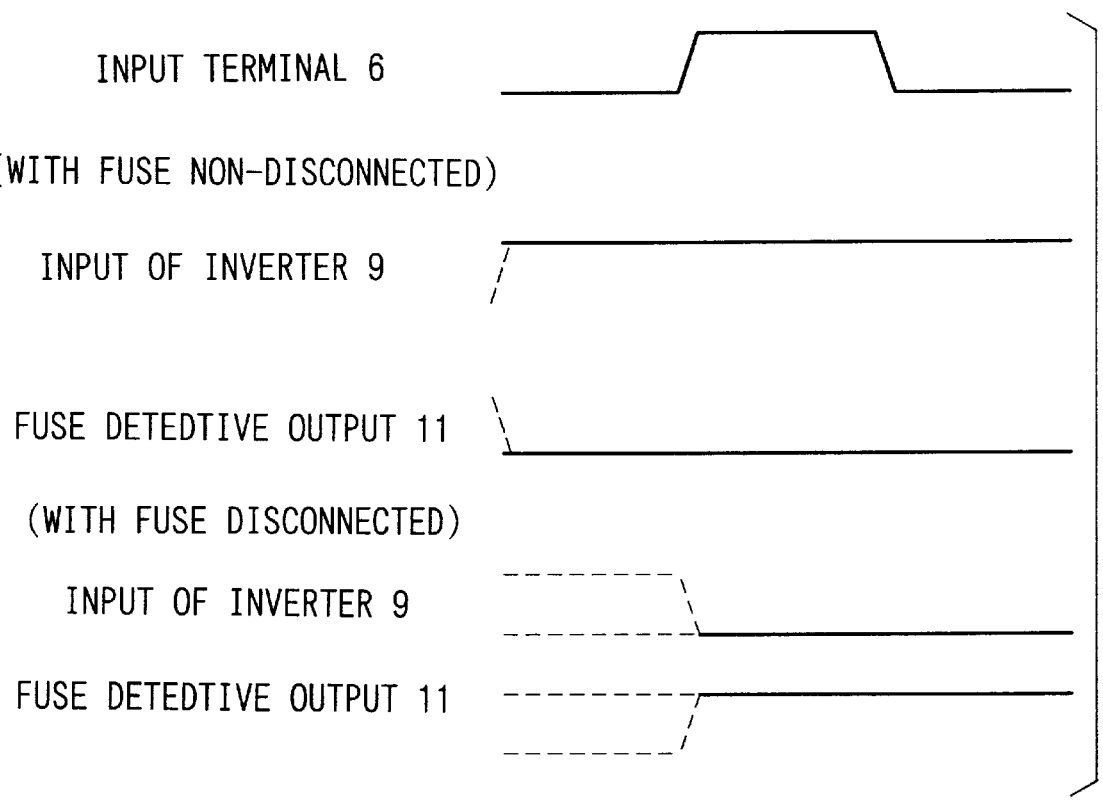
FIG. 7 is a timing chart showing operations of the second conventional example.
Figure 8:
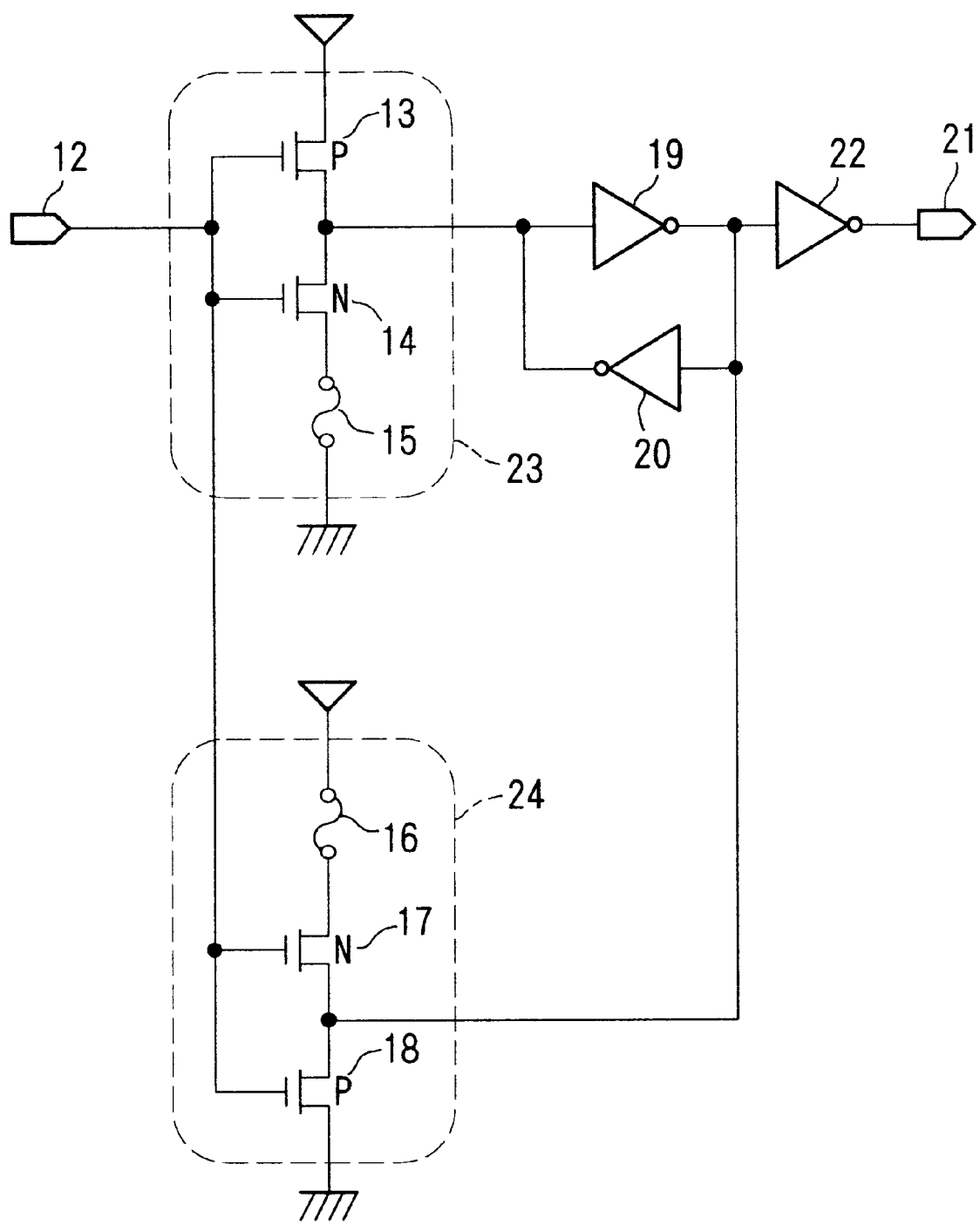
FIG. 8 is a circuit diagram showing the third conventional example.
Figure 9:
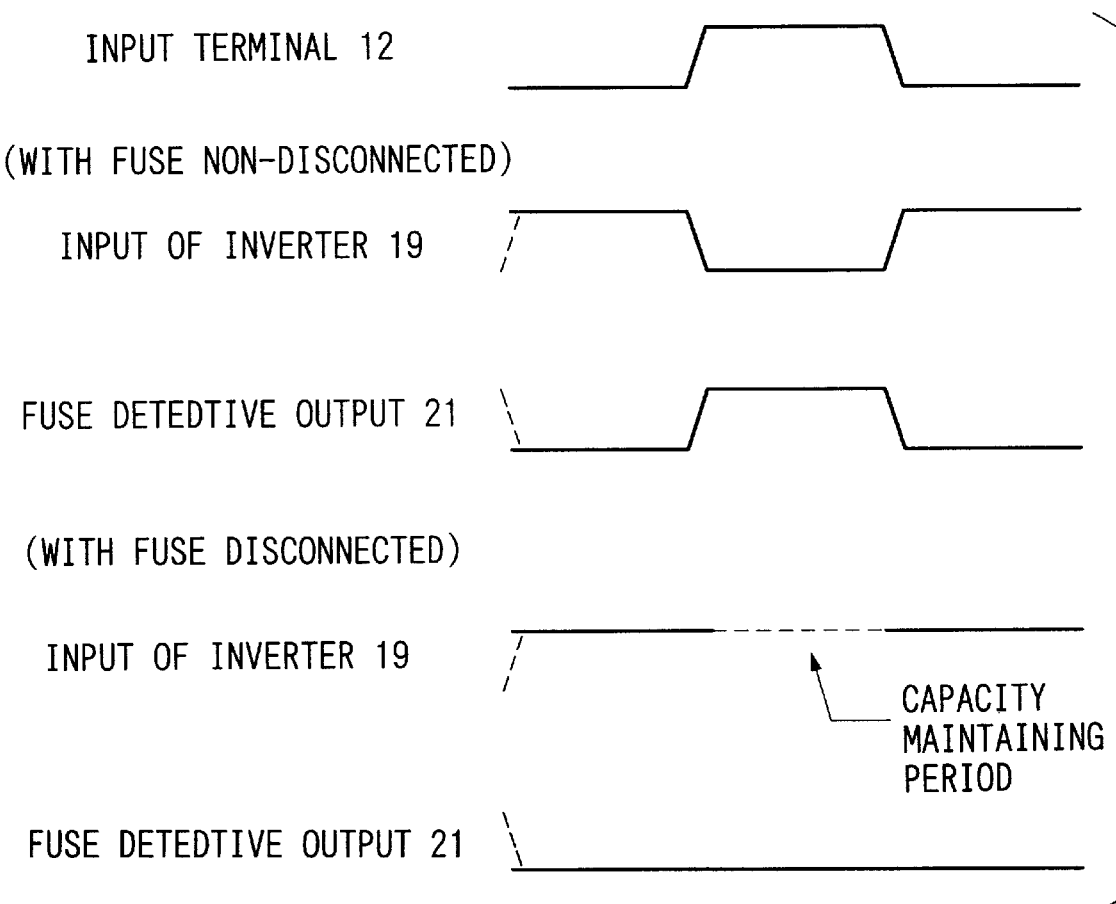
FIG. 9 is a timing chart showing operations of the third conventional example.

Next, the third embodiment of the present invention will be explained. FIG. 4 is a circuit diagram showing the structure of a semiconductor integrated circuit of the third embodiment according to the present invention, in which a signal-width adjustment circuit is added to the circuit of the above-explained first embodiment. Here, parts corresponding to those in FIG. 1 are given identical reference numerals, and explanations thereof are omitted. In FIG. 4, signal-width adjustment circuit 51 is inserted between input terminal 30 and inverter 52, and the adjustment circuit 51 adjusts the width of the High signal applied to input terminal 30 to have a specified period. As described above, a reason for generating through current is that the input signal at input terminal 30 has a long "High" period. In the third embodiment, the width of such an input High signal is adjusted to have a specified period via signal-width adjustment circuit 51, by which generation of through current is prevented.

What is claimed is:

1. A semiconductor integrated circuit comprising:

a fuse circuit for judging whether a fuse element is disconnected or not by using an output signal output in relation to an input signal, wherein at least one fuse element is inserted, and if the fuse element is not disconnected, then the output signal is inverted with respect to the input signal, while if the fuse element is disconnected, then the level of the output signal is fixed to that of a source voltage or a ground voltage regardless of the input signal;

a flip-flop circuit whose input is the output of the fuse circuit; and a delay circuit for delaying the input signal, wherein the output of the delayed circuit becomes the clock input of the flip-flop circuit, and information indicating whether the fuse element is connected or not is output form the flip-flop circuit.

2. A semiconductor integrated circuit as claimed in claim 1, wherein:

the fuse circuit comprises a CMOS inverter circuit including a first conductive MOSFET and a second conductive MOSFET, and said at least one fuse element is inserted at the side of the drain or the source of any one of the first and second conductive MOSFETs.

3. A semiconductor integrated circuit as claimed in claim 1, wherein the flip-flop circuit includes a clocked inverter as an initial stage input element of the circuit.

4. A semiconductor integrated circuit as claimed in claim 1, further comprising a signal-width adjustment circuit for adjusting the width of the input signal to have a predetermined period possible for capacitively maintaining a High level.

* * * * *